US012776777B2

(12) United States Patent
Saxena et al.

(10) Patent No.: US 12,776,777 B2
(45) Date of Patent: Oct. 27, 2026

(54) METHODS AND SEMICONDUCTOR INTEGRATED CIRCUITS FOR MANAGING LOGICAL BEHAVIOUR OF FLOATING INPUT PIN

(71) Applicant: Samsung Electronics Co., Ltd., Suwon-si (KR)

(72) Inventors: Himanshu Saxena, Bengaluru (IN); Ankur Gupta, Bengaluru (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/818,812

(22) Filed: Aug. 29, 2024

(65) Prior Publication Data

US 2026/0025138 A1 Jan. 22, 2026

(30) Foreign Application Priority Data

Jul. 18, 2024 (IN) ............................ 202441055006

(51) Int. Cl.

| | |
|---|---|
| ***H03K 19/003*** | (2006.01) |
| ***H03K 19/00*** | (2006.01) |
| ***H03K 19/017*** | (2006.01) |
| ***H03K 19/094*** | (2006.01) |

(52) U.S. Cl.

CPC ... *H03K 19/00315* (2013.01); *H03K 19/0002* (2013.01); *H03K 19/01721* (2013.01); *H03K 19/09425* (2013.01)

(58) Field of Classification Search

CPC ....... H03K 19/00315; H03K 19/01721; H03K 19/0002; H03K 19/09425

See application file for complete search history.

(56) References Cited

U.S. PATENT DOCUMENTS

| | | | | |
|---|---|---|---|---|
| 5,124,590 | A | 6/1992 | Liu et al. | |
| 5,973,511 | A | 10/1999 | Hsia et al. | |
| 10,878,149 | B1 | 12/2020 | Newcomb | |
| 11,705,904 | B2 | 7/2023 | Mangano et al. | |
| 2007/0085588 | A1 | 4/2007 | Tseng | |
| 2008/0150577 | A1 | 6/2008 | Ueno | |
| 2010/0277220 | A1 * | 11/2010 | Stoerk ................ | H03K 19/0019 327/437 |
| 2012/0062312 | A1 * | 3/2012 | Tomioka ................ | G05F 3/245 327/543 |
| 2013/0214820 | A1 | 8/2013 | Hung et al. | |

(Continued)

FOREIGN PATENT DOCUMENTS

| | | |
|---|---|---|
| CN | 114942897 A | 8/2022 |
| KR | 100480563 B1 | 5/2005 |

(Continued)

*Primary Examiner* — Daniel D Chang

(74) *Attorney, Agent, or Firm* — Wolf, Greenfield & Sacks, P.C.

(57) ABSTRACT

A semiconductor integrated circuit, comprising: an input pin; a switch having a drain terminal electrically connected to the input pin, and configured to be in an ON mode or an OFF mode, responsive to a state of the input pin; a first logic block electrically connected to a gate terminal of the switch and a source terminal of the switch; a second logic block electrically connected to the gate terminal of the switch; and a first node electrically connected to the first logic block, the second logic block, and the gate terminal of the switch.

20 Claims, 14 Drawing Sheets

(56) References Cited

U.S. PATENT DOCUMENTS

| | | | |
|---|---|---|---|
| 2014/0097824 | A1 | 4/2014 | Knoedgen |
| 2016/0336939 | A1 | 11/2016 | Tsai |
| 2018/0109251 | A1 | 4/2018 | Djelassi et al. |

FOREIGN PATENT DOCUMENTS

| | | | |
|---|---|---|---|
| KR | 20070089446 | A | 8/2007 |
| KR | 20080064602 | A | 7/2008 |

* cited by examiner

METHODS AND SEMICONDUCTOR INTEGRATED CIRCUITS FOR MANAGING LOGICAL BEHAVIOUR OF FLOATING INPUT PIN

CROSS-REFERENCE TO RELATED APPLICATIONS TECHNICAL FIELD

This present application claims priority to and the benefit under 35 U.S.C. § 119 (a)-(d) of Indian Patent Application number 202441055006, filed on Jul. 18, 2024, in the Office of the Controller General of Patents, Designs, and Trade Marks, the entire disclosure of which is incorporated herein by reference.

TECHNICAL FIELD

Embodiments disclosed herein relate to semiconductor integrated circuits, and more particularly to managing a logical behaviour of a semiconductor integrated circuit.

BACKGROUND OF THE INVENTION

In a semiconductor integrated circuit (IC), some of input/output (I/O) pins (e.g., general purpose I/O (GPIO) pins and/or configurable I/O pins) may not be connected to a voltage source or a ground. Such unused (digital) I/O pins (if left electrically unconnected to the voltage source and ground) may be referred to as being floated, a state of which can cause unexpected logic behaviour and/or excess current draw into the circuit. For example, the input's logic level (at the floated I/O pins) may change at any time and trigger unexpected responses of the semiconductor IC. If the unused (digital) I/O pins are overlooked at the time of designing the semiconductor IC, the unused I/O pins may create problems when left in a floating state. Hereinafter, the semiconductor IC may be referred to as a chip, an integrated circuit chip, an IC chip, a circuit, a semiconductor integrated circuit, an IC, or the like.

In the semiconductor IC (e.g., microcontrollers), users may power up the I/O pins as inputs because the desired output level is not initially known. In some embodiments, the unused I/O pins may be configured as outputs and be driven high or low through external programming to avoid floating state. Unless all paths of the circuit involved to the unused I/O pins are driven high or low through the external programming, there may be a mode where at least one of the unused I/O pins is still being floating.

FIGS. 1A and 1B show some examples of the schematic diagrams for circuits to manage the floating state of an input pin. Hereinafter, the input pin may refer to a portion of the I/O pins or each I/O pin. An external pull-up and/or pull-down resistor (R) may be used to ensure the states of lines, while the chip is in reset, or the I/O (e.g., the state of the I/O pins) are still being configured. Some chips may incorporate internal pull-up resistor circuit and/or internal pull-down resistor circuit as part of their (digital) input circuits, which may be programmed to enable the internal termination during device programming under software control. If internal termination is not available, external pull-up resistor and/or external pull-down resistor or external resistor networks may be designed (e.g., electrically connected to the chip) for avoiding the floating state of the input pin.

In some examples, the circuits of the chips may need reference voltage for the pull-up circuit and/or pull-down circuit to work. Some examples of the chips may have bidirectional I/O pins only. In others, external programming may be needed to configure the I/O pins as output and drive them high or low according to the logic of the IC chip.

OBJECTS OF THE INVENTION

An object of the embodiments of the present inventive concepts herein is to disclose a semiconductor integrated circuit, and more particularly disclose managing a logical behaviour of an input pin in a floating state in the semiconductor integrated circuit.

Another object of the embodiments of the present inventive concepts herein is to disclose methods and semiconductor integrated circuits for generating a pull-up current ($I_{pull}$) by a pull-up current generation block along with a P-type of transistor logic which turns a transistor switch ON when the input pin is in a floating state.

Another object of the embodiments of the present inventive concepts herein is to disclose methods and semiconductor integrated circuits for pulling up a first node of the transistor switch by the generated pull-up current when the input pin is in a floating state.

Another object of the embodiments of the present inventive concepts herein is to disclose methods and semiconductor integrated circuits for grounding the input pin current down through the transistor switch when the input pin is in a floating state.

Another object of the embodiments of the present inventive concepts herein is to disclose methods and semiconductor integrated circuits for pulling the input pin up to the voltage source through the transistor switch when the input pin is in a floating state.

Another object of the embodiments of the present inventive concepts herein is to disclose methods and semiconductor integrated circuits for mirroring the generated pull-up current by the pull-up current generation block by the P-type transistor logic block.

Another object of the embodiments of the present inventive concepts herein is to disclose mirroring the generated current in the pull-down current generator block by the first transistor block of N-type transistor logic block.

The present inventive concepts may not be limited to the embodiments as described above and may be implemented in various different forms. Therefore, it should be understood that the embodiments as described above are not restrictive but illustrative in all respects.

SUMMARY OF THE INVENTION

A semiconductor integrated circuit, comprising: an input pin; a switch having a drain terminal electrically connected to the input pin, and configured to be in an ON mode or an OFF mode, responsive to a state of the input pin; a first logic block electrically connected to a gate terminal of the switch and a source terminal of the switch; a second logic block electrically connected to the gate terminal of the switch; and a first node electrically connected to the first logic block, the second logic block, and the gate terminal of the switch.

A semiconductor integrated circuit, comprising: an input pin; a switch including an N-type transistor having a drain terminal electrically connected to the input pin, said switch configured to be in an ON mode or an OFF mode in response to a state of the input pin; a first logic block electrically connected to the switch, said first logic block including an N-type transistor logic block, which is electrically connected to a ground voltage, configured to generate a sink current, and comprises: a first transistor block; and a pull-down current generation block electrically connected to the first transistor block, and a gate terminal and a source terminal of the N-type transistor; a second logic block electrically connected to the gate terminal of the N-type transistor; and a first node electrically connected to the first logic block, the second logic block, and the switch.

A semiconductor integrated circuit, comprising: an input pin; a switch, wherein the switch is electrically connected to the input pin; a first logic block, wherein the first logic block is electrically connected to the switch; a second logic block, wherein the second logic block is electrically connected the switch; and a first node that is electrically connected to the first logic block, the second logic block, and the switch, wherein the switch is configured to be in an ON mode or an OFF mode, responsive to a state of the input pin, wherein the switch comprises a P-type transistor, wherein the first logic block comprises a P-type transistor logic block, wherein the P-type transistor logic block comprises a current mirror block and a pull-up current generation block, wherein the pull-up current generation block is electrically connected to the current mirror block, wherein the pull-up current generation block is electrically connected a gate terminal and a source terminal of the P-type transistor, wherein the second logic block is electrically connected to the gate terminal of the P-type transistor, wherein the input pin is electrically connected to a drain terminal of the P-type transistor, wherein the P-type transistor logic block is electrically connected to a voltage source, and wherein the P-type transistor logic block is configured to generate a pull-up current.

These and other aspects of the example embodiments herein will be better appreciated and understood when considered in conjunction with the following description and the accompanying drawings. It should be understood, however, that the following descriptions, while indicating example embodiments and numerous specific details thereof, are given by way of illustration and not of limitation. Many changes and modifications may be made within the scope of the example embodiments herein without departing from the spirit thereof, and the example embodiments herein include all such modifications.

BRIEF DESCRIPTION OF FIGURES

Embodiments herein are illustrated in the accompanying drawings, throughout which like reference letters may indicate corresponding parts in the various figures unless clearly stated otherwise. The embodiments herein will be better understood from the following description with reference to the drawings, in which.

DETAILED DESCRIPTION

Figure 1A:
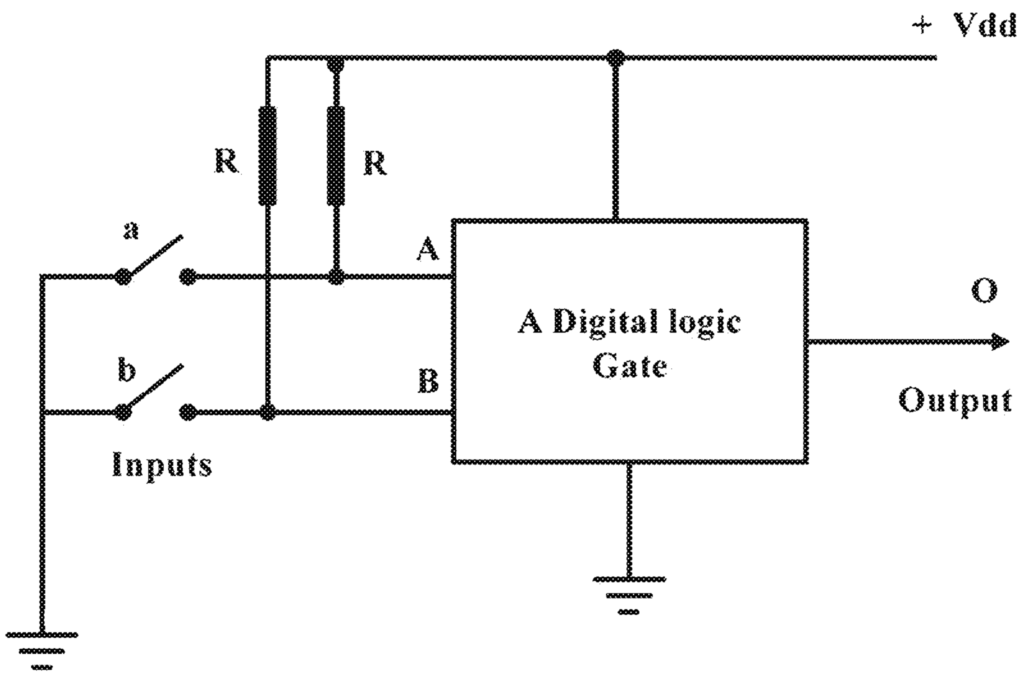
FIGS. 1A and 1B show some examples of the schematic diagrams for circuits to manage the floating state of an input pin.
Figure 1B:
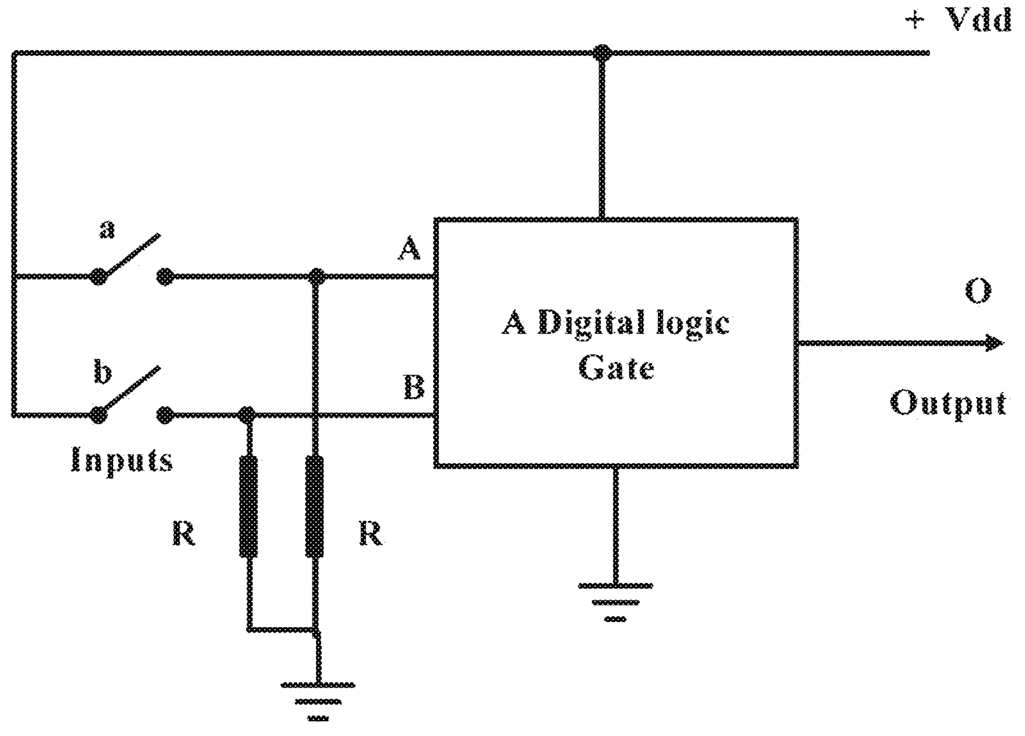

The example embodiments herein and the various features and advantageous details thereof are explained more fully with reference to the non-limiting embodiments that are illustrated in the accompanying drawings and detailed in the following description. Descriptions of well-known components and processing techniques may be omitted so as to not unnecessarily obscure the embodiments herein. The description herein is intended merely to facilitate an understanding of ways in which the example embodiments herein can be practiced and to further enable those of skill in the art to practice the example embodiments herein. Accordingly, this disclosure should not be construed as limiting the scope of the example embodiments herein.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension. It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the present disclosure.

It will be also understood that, even if a certain step or operation is described later than another step or operation, the step or operation may be performed later than or simultaneously with the other step or operation unless the other step or operation is specifically described as being performed after the step or operation.

In an embodiment herein, a semiconductor integrated circuit (IC) may comprise a plurality of input output (I/O)

pins. The I/O pins maybe general-purpose input output pins or configurable input output pins. The I/O pins may be in a floating state. To manage the logical behaviour of the I/O pins, semiconductor integrated circuit (IC) may comprise a pull-up circuit comprising a P-type transistor logic block. The P-type logic block may comprise a pull-up current generation block connected to a current mirror block, wherein the pull-up current generation block may be used for generating a pull-up current ($I_{pull}$). Herein the semiconductor IC may be referred to as a chip, an integrated circuit chip, an IC chip, a circuit, an integrated circuit, or an IC. In addition, a "connection" may include an "electrical connection". The "electrical connection" conceptually includes a physical connection and a physical disconnection. The semiconductor IC may further comprise a transistor switch connected to an input pin (of the I/O pins) at a drain of the transistor switch. In an embodiment, the semiconductor IC may comprise a pull-down circuit comprising an N-type transistor logic block. In an embodiment herein, the N-type transistor logic block may comprise a first transistor block and a second transistor block (e.g., a pull-down current generation block). The first transistor block may be connected to a source terminal of the transistor switch. The second transistor block may be connected to the first transistor block and the P-type of transistor logic block. The N-type of transistor logic block may be configured for generating a sink current ($I_{sink}$) using an input pin current.

Figure 2A:
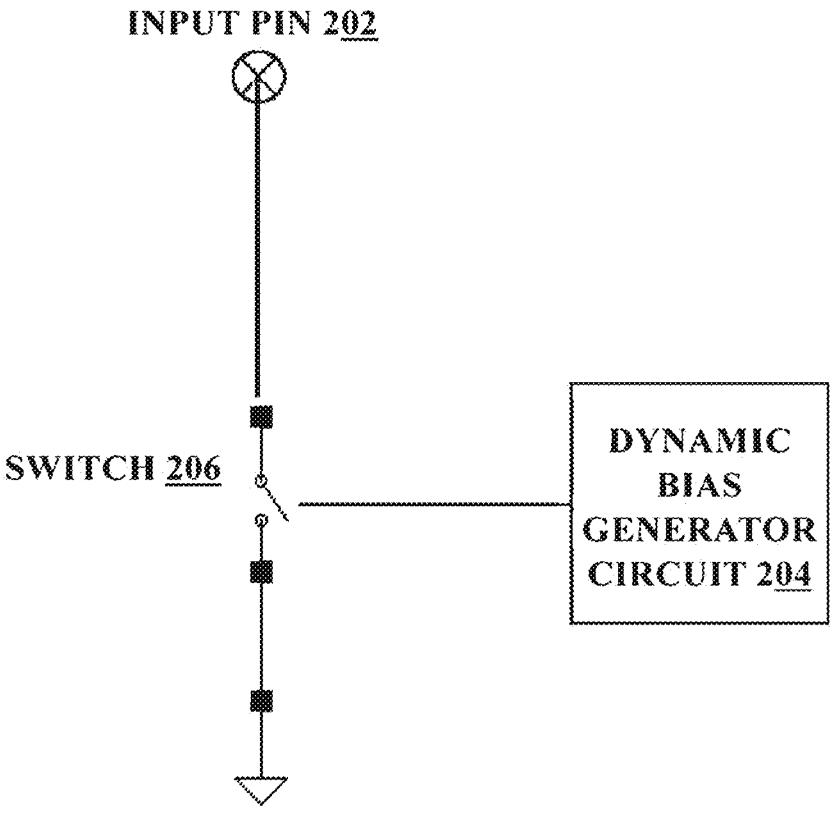
FIG. 2A shows a block diagram for a pull-down circuit of a semiconductor integrated circuit to manage the floating state of the input pin, according to embodiments as disclosed herein.

FIG. 2A shows a block diagram for a pull-down circuit of a semiconductor integrated circuit to manage the floating state of the input pin, according to embodiments as disclosed herein. The semiconductor integrated circuit for managing the logical behaviour of the input pin (of the I/O pins) in a floating state may comprise an input pin (202), a dynamic bias generator circuit (204), and a switch (206). The switch (206) may be a transistor switch. In an embodiment herein the transistor switch may be a field effect transistor (FET) switch. The transistor switch may be a N-type of transistor switch. The logical behaviour of the dynamic bias generator circuit (204) may turn the switch (206) ON and OFF. A drain terminal of the switch (206) may be connected to the input pin (202). The dynamic bias generator circuit (204) may be connected to a gate terminal and a source terminal of the switch (206). In an embodiment herein, the dynamic bias generator circuit (204) may generate a voltage bias in the circuit, when the input pin (202) is in a floating state. The voltage bias generated in the dynamic bias generator circuit (204) may drive the switch (206) ON which pulls the input pin (202) down (to the ground). Therefore, the semiconductor integrated circuit may manage the input pin (202) in the floating state to avoid (or to prevent) unexpected logic behaviour and excess current drawn by the input pin (202).

In an embodiment herein, the dynamic bias generator circuit (204) may generate a sink current ($I_{sink}$) across the dynamic bias generator circuit (204) and the source terminal of the switch (206) when the input pin (202) is connected to deliver an input (e.g., a normal input signal, which is not an unexpected or excess signal caused by the floating state) to the semiconductor integrated circuit. As the generated sink current ($I_{sink}$) is greater than a pull-up current in the dynamic bias generator circuit (204), the switch (206) may turn OFF.

Figure 2B:
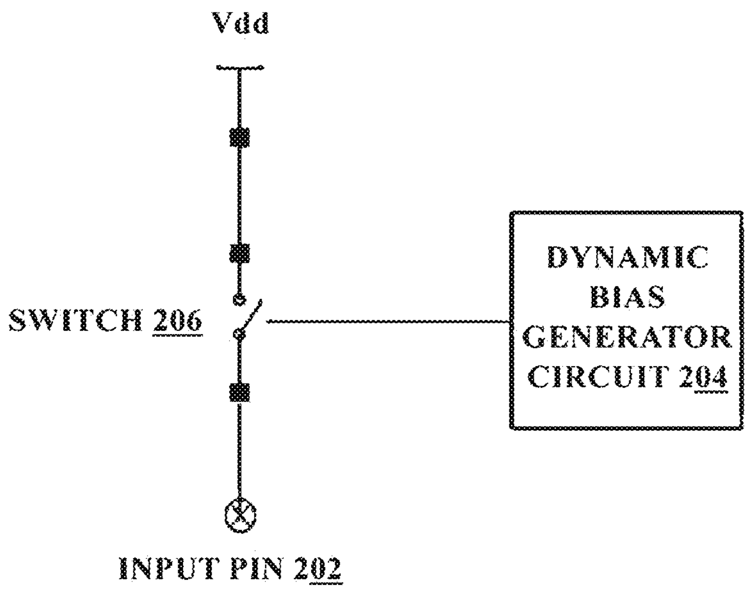
FIG. 2B shows a block diagram for a pull-up circuit of a semiconductor integrated circuit to manage the floating state of the input pin, according to embodiments as disclosed herein.

FIG. 2B shows a block diagram for a pull-up circuit of a semiconductor integrated circuit to manage the floating state of the input pin, according to embodiments as disclosed herein. The circuit for managing the logical behaviour of the input pin in a floating state may comprise an input pin (202), a dynamic bias generator circuit (204), and a switch (206). In an embodiment herein, the switch (206) may be a transistor switch. In an embodiment herein the transistor switch may be a FET switch. The transistor switch may be a P-type of transistor switch. The logical behaviour of the dynamic bias generator circuit (204) may turn the switch (206) ON and OFF. A drain terminal of the switch (206) may be connected to the input pin (202). The dynamic bias generator circuit (204) may be connected to a gate terminal and a source terminal of the switch (206). In an embodiment herein, the dynamic bias generator circuit (204) may generate a voltage bias in the circuit, when the input pin (202) is in a floating state. The voltage bias generated in the dynamic bias generator circuit (204) may drive the switch (206) ON which pulls the input pin (202) up to a voltage source Vad. The voltage source Vad may be connected to the source terminal of the switch (206). Therefore, the semiconductor integrated circuit may manage the input pin (202) in the floating state to avoid (or to prevent) unexpected logic behaviour and excess current drawn by the input pin (202).

In an embodiment herein, the dynamic bias generator circuit (204) may generate a sink current ($I_{sink}$) across the dynamic bias generator circuit (204) and the source terminal of the switch (206) when the input pin is connected to deliver an input (e.g., a normal input signal, which is not an unexpected or excess signal caused by the floating state). As there is no pull-up current generated in the dynamic bias generator circuit (204), the switch (206) may turn OFF.

Figure 2C:
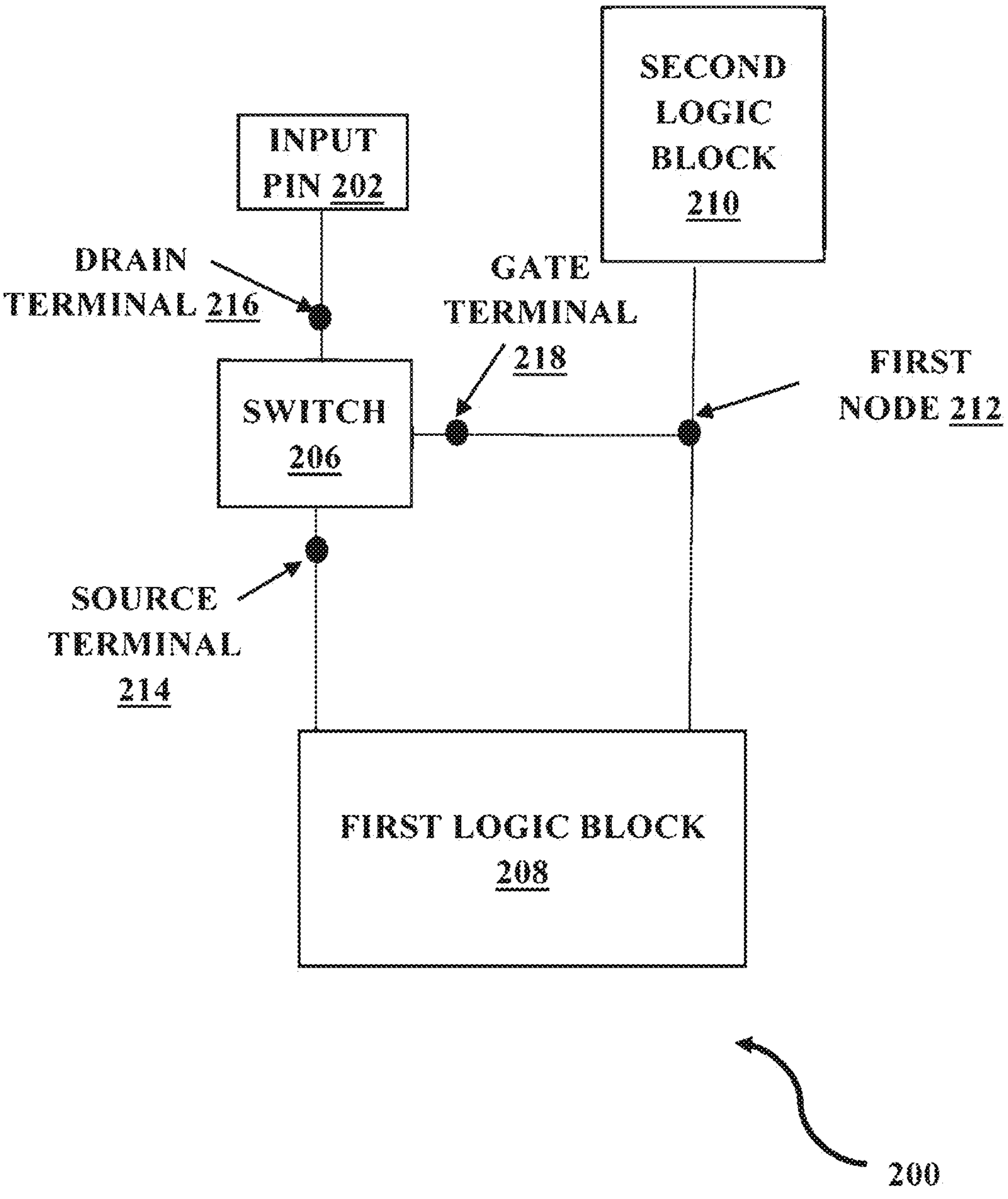
FIG. 2C shows a block diagram for a semiconductor integrated circuit to manage the floating state of the input pin, according to embodiments as disclosed herein.

FIG. 2C shows a block diagram for a semiconductor integrated circuit to manage the floating state of the input pin, according to embodiments as disclosed herein. A semiconductor integrated circuit (200) may comprise the input pin (202); a first logic block (208), a second logic block (210), and a switch (206). The first logic block (208) may be connected to a gate terminal (218) of the switch (206), a source terminal (214) of the switch (206), and the second logic block (210). The second logic block (210) may be connected to the gate terminal (218) of the switch (206). The drain terminal (216) of the switch (206) may be connected to the input pin (202). A first node (212) may be formed among the first logic block (208), the second logic block (210), and the gate terminal (218) of the switch (206). For example, the first node (212) may be electrically connected to (e.g., electrically disposed among) the first logic block (208), the second logic block (210), and the gate terminal (218) of the switch (206).

In an embodiment herein, the first logic block (208) may generate a first voltage logic value to drive the switch (206) in an ON mode in the semiconductor integrated circuit (200), when the input pin (202) is in a floating state. The semiconductor integrated circuit (200) may perform at least one of a pull-up action and a pull-down action on the input pin (202) through the switch (206) to manage the floating state of the input pin (202). Therefore, the input pin (202) may be pulled-up to logic high or grounded (e.g., may be pulled-down to the ground), when the input pin (202) is (detected) in the floating state.

In an embodiment herein, the second logic block (210) may generate a first current value, such that the first node (212) is connected with the second logic block (210) based on the first current value and the gate terminal (218) of the switch (206) is in ON mode, when the input pin (202) is in the floating state. As a result, the switch (206) in ON mode may pull the input pin (202) down to the ground.

In an embodiment herein, the first logic block (208) may generate a second voltage logic value in the semiconductor integrated circuit (200), when the input pin (202) is connected to a high logic input (e.g., a normal input signal, which is not an unexpected or excess signal caused by the floating state). In an embodiment herein, the second voltage logic value may be made equal to a bias voltage of the switch (206). The first node (212) may be connected to the first logic block (208) based on the second voltage logic value. The second voltage logic value generated in the first logic block (208) may be given at the gate terminal of the switch (206). As a result, the second voltage logic value may drive the switch (206) to OFF mode.

In an embodiment herein, the semiconductor integrated circuit (200) automatically turns off, when an external voltage (e.g., the high logic input) is applied to the input pin (202).

Figure 3A:
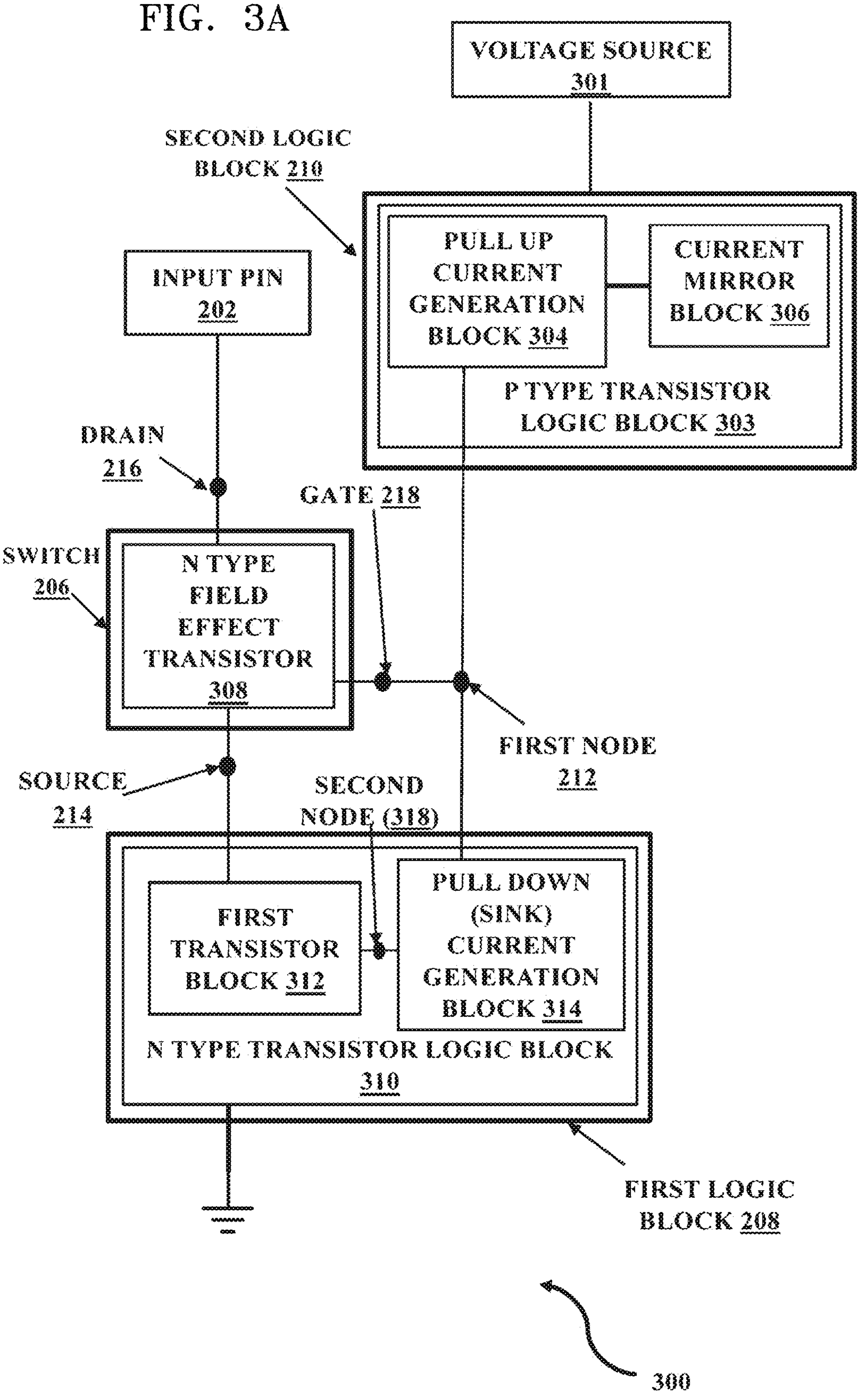
FIG. 3A shows a detailed block diagram for a semiconductor integrated circuit comprising a pull-down circuit to manage the floating state of the input pin, according to embodiments as disclosed herein.

FIG. 3A shows a detailed block diagram for a semiconductor integrated circuit (300) comprising a pull-down circuit to manage the floating state of the input pin, according to embodiments as disclosed herein. In an embodiment herein, the first logic block (208) may comprise an N-type transistor logic block (310). The second logic block (210) may comprise a P-type transistor logic block (303). The switch (206) may comprise an N-type transistor switch (308). In an embodiment herein, the semiconductor integrated circuit (300) may comprise the input pin (202), a voltage source (301), a P-type transistor logic block (303), an N-type transistor switch (308), and an N-type transistor logic block (310). The P-type transistor logic block (303) may be a pull-up circuit. The N-type transistor logic block (310) may be a pull-down circuit. The N-type transistor logic block (310) may be connected to the ground. The P-type transistor logic block (303) may be connected to the voltage source (301).

In an embodiment herein, the P-type transistor logic block (303) may comprise a pull-up current generation block (304) and a current mirror block (306). The pull-up current generation block (304) and the current mirror block (306) may comprise a plurality of P-type transistors. In an embodiment herein, the P-type transistors may be P-type field effect transistors (FETs). The field effect transistors may be, but not limited to a junction field effect transistor (JFET), a metal-semiconductor FET (MESFET), an insulated gate FET, and/or a metal oxide semiconductor FET (MOSFET). The P-type transistors may be connected to each other in series as a cascade of transistors in the current mirror block (306). In an embodiment herein, the P-type transistor logic block (303) may perform an inverter logic function. The current mirroring block (306) may sense a pull-up current (generated by the pull-up current generation block (304)) and may generate a copy of the generated pull-up current, with the same characteristics. The replicated current (e.g., the current copied from the pull-up current) may be as stable as the reference current source (the pull-up current) as the impedance of the mirroring circuit is matching.

In an embodiment herein, the first node (212) may be formed among (e.g., may be electrically connected to or electrically disposed among) the pull-up current generation block (304), a pull-down current generation block (314), and the gate terminal (218) of the N-type transistor switch (308) (of the switch (206)). The P-type transistor logic block (303) may generate a first current value when the P-type transistor logic block (303) is connected to a voltage source (301). The first current value may comprise the pull-up current, and the current mirror block (306) may mirror the pull-up current generated at the pull-up current generation block (304).

In an embodiment herein, further, the P-type transistor logic block (303) may be connected to the N-type transistor logic block (310). The N-type transistor logic block (310) may comprise a first transistor block (312) and a pull-down current generation block (314). In an embodiment herein, the pull-up current generation block (304) may be connected to the pull-down current generation block (314). The pull-down current generation block (314) may be further connected to the first transistor block (312).

In an embodiment herein, the first transistor block (312) may be connected to the source terminal (214) of the N-type transistor switch (308), and the pull-down current generation block (314) may be connected to the first transistor block (312) and the gate terminal (218) of the N-type transistor switch (308). Furthermore, the N-type transistor logic block (310) may be connected to a ground. The N-type transistor logic block (310) may generate a sink current ($I_{sink}$) using an input pin current.

In an embodiment herein, the N-type transistor logic block (310) may comprise a plurality of N-type transistors. In an embodiment herein, the N-type transistors may be N-type FETs. The FETs may be, but not limited to a junction field effect transistor (JFET), a metal-semiconductor FET (MESFET), an insulated gate FET, and/or a metal oxide semiconductor FET (MOSFET). In an embodiment herein, the N-type transistors in the first transistor block (312) may be connected to each other in series as a cascade of transistors. Similarly, the N-type transistors in the pull-down current generation block (314) may be connected to each other in series as a cascade of transistors. In an embodiment herein, the transistors in the first transistor block (312) may be mirroring the transistors of the pull-down current generation block (314). The pull-down current generation block (314) may comprise a current mirror circuit. The N-type transistor logic block (310) may generate the sink current ($I_{sink}$). The N-type transistor logic block (310) may be a current mirroring circuit. The first transistor block (312) may be mirroring the pull-down current generation block (314) to perform the current mirroring. The N-type transistor logic block (310) may be connected with the N-type transistor switch (308) and perform a power-on reset logic function in a second configuration mode in which the input pin (202) is connected to an input source.

In an embodiment herein, in a first configuration mode, in which the input pin (202) is in floating state, the first transistor block (312) may generate a bias voltage that turns the pull-down current generation block (314) OFF. The sink current ($I_{sink}$) may be generated from the first node (212) to the pull-down current generation block (314). Simultaneously, the pull-up current generation block (304) may generate a pull-up current. The pull-up current may be mirrored by the current mirror block (306). The first node (212) may be pulled up by the pull-up current generated by the pull-up current generation block (304), wherein the sink current ($I_{sink}$) generated by the first transistor block (312) is lesser in value than the generated pull-up current. When the first node (212) is pulled up by the pull-up current, the N-type transistor switch (308) may be turned ON to pull the input pin (202) down and ground the input pin (202).

In an embodiment herein, in a second configuration mode, in which the input pin (202) is connected to an input source (e.g., a normal input signal, which is not an unexpected or excess signal caused by the floating state), and the input pin (202) is set as high (e.g., high logic input or high logic voltage), the first transistor block (312) may generate a bias voltage that turns the pull-down current generation block (314) ON. The sink current ($I_{sink}$) may be generated from the first node (212) to the pull-down current generation block (314). The generated sink current value may be multiple times greater than an input current value. Simultaneously the pull-up current generation block (304) may generate a pull-up current. The pull-up current may be mirrored by the current mirror block (306). As the sink current ($I_{sink}$) is greater in value than the generated pull-up current and the pull-up current generation block (304) is ON, the first node (212) may be pulled down. As the first node (212) is pulled down, the N-type transistor switch (308) may be turned OFF. Therefore, no current flows through the N-type transistor switch (308).

Figure 3B:
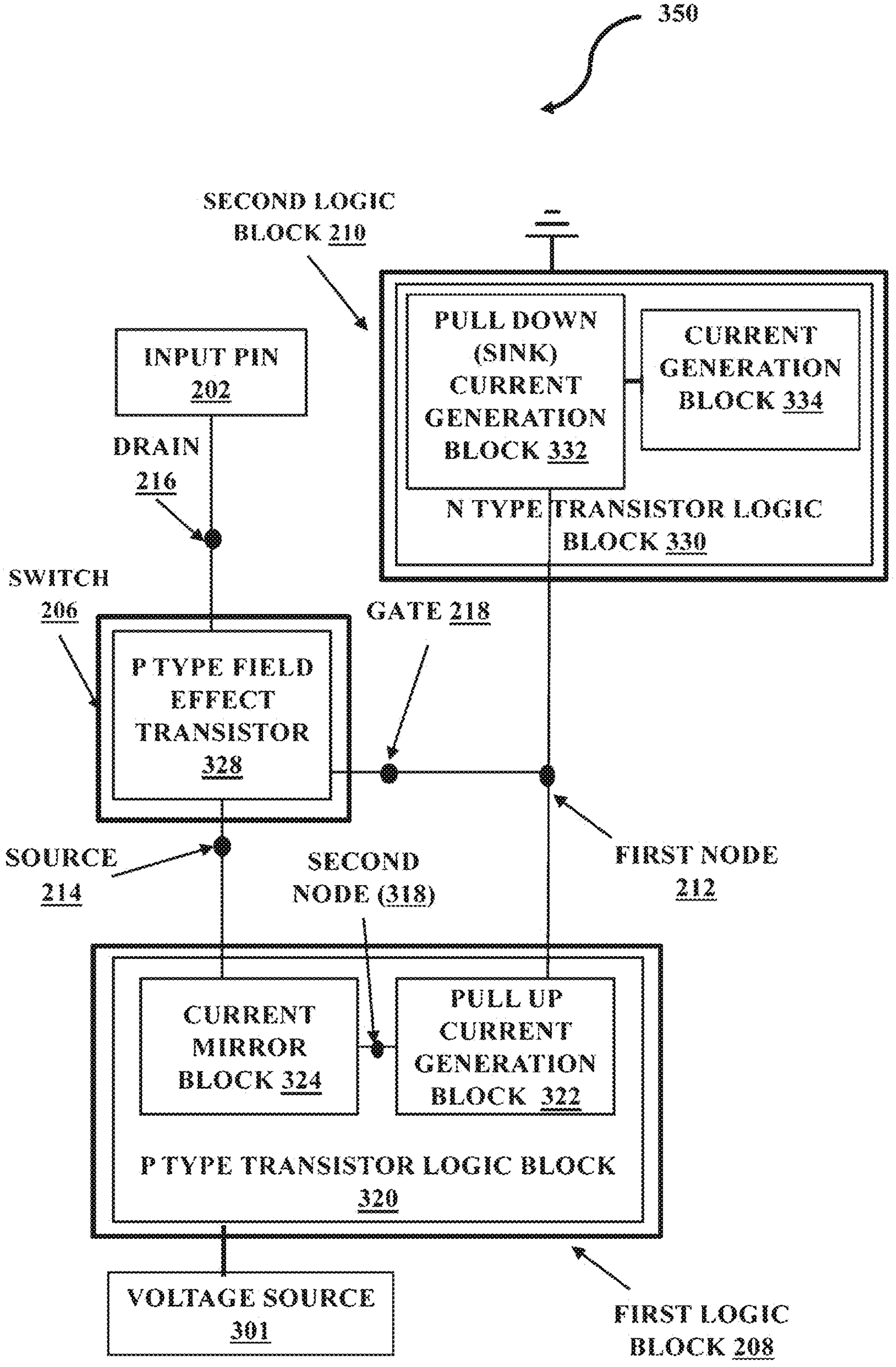
FIG. 3B shows a detailed block diagram for a semiconductor integrated circuit comprising a pull-up circuit to manage the floating state of the input pin, according to embodiments as disclosed herein

FIG. 3B shows a detailed block diagram for a semiconductor integrated circuit (350) comprising a pull-up circuit to manage the floating state of the input pin, according to embodiments as disclosed herein. In an embodiment herein, the input pin (202) may be connected to the drain terminal (216) of the switch (206). The first logic block (208) may comprise a P-type transistor logic block (320). The second logic block (210) may comprise a N-type transistor logic block (330). The switch (206) comprises a P-type transistor switch (328). In an embodiment herein, the semiconductor integrated circuit (350) may comprise the input pin (202), a voltage source (301), the P-type transistor logic block (320), the P-type transistor switch (328), and the N-type transistor logic block (330). The P-type transistor logic block (320) may be a pull-up circuit. The N-type transistor logic block (330) may be a pull-down circuit. The N-type transistor logic block may be connected to the ground. The P-type transistor logic block may be connected to the voltage source (301).

In an embodiment herein, the P-type transistor logic block (320) may comprise a pull-up current generation block (322) and a current mirror block (324). The pull-up current generation block (322) and the current mirror block (324) may comprise a plurality of P-type transistors. In an embodiment herein, the P-type transistors may be P-type field effect transistors (FETs). The field effect transistors may be, but not limited to a junction field effect transistor (JFET), a metal-semiconductor FET (MESFET), an insulated gate FET, and/or a metal oxide semiconductor FET (MOSFET). The P-type transistors may be connected to each other in series as a cascade of transistors in the pull-up current generation block (322).

In an embodiment herein, the current mirror block (324) may be connected to the source terminal (214) of the P-type transistor switch (328), and a pull-down current generation block (332) may be connected to the pull-up current generation block (322) and the gate terminal (218) of the P-type transistor switch (328). The P-type transistor logic block (320) may be connected to a voltage source (301). The P-type transistor logic block (320) may generate a pull-up current ($I_{pull}$) using the input pin current.

In an embodiment herein, further, the P-type transistor logic block (320) may be connected to the N-type transistor logic block (330). The N-type transistor logic block (330) may comprise a pull-down current generation block (332) and a current generation block (334). In an embodiment herein, the pull-down current generation block (332) may be connected to the current generation block (334). The current generation block (334) may be connected to the gate terminal (218) of the P-type transistor switch (328). In an embodiment herein, the first node (212) may be formed among (e.g., may be electrically connected to or electrically disposed among) the pull-up current generation block (322) of the P-type transistor logic block (320), the pull-down current generation block (332), and the gate terminal (218) of the P-type transistor switch (328).

In an embodiment herein, the N-type transistor logic block (330) may be connected to the ground. The N-type transistor logic block (330) may generate the first current value through the input pin current, wherein the first current value may comprise a sink current ($I_{sink}$).

In an embodiment herein, the N-type transistor logic block (330) may comprise a plurality of N-type transistors. In an embodiment herein, the N-type transistors may be N-type FETs. The FETs may be, but not limited to a junction field effect transistor (JFET), a metal-semiconductor FET (MESFET), an insulated gate FET, and/or a metal oxide semiconductor FET (MOSFET). In an embodiment herein, the N-type transistors in the current generation block (334) may be connected to each other in series as a cascade of transistors. Similarly, the N-type transistors in the pull-down current generation block (332) may be connected to each other in series as a cascade of transistors. In an embodiment herein, the transistors (e.g., the N-type transistors) in the current generation block (334) may be mirroring the transistors (e.g., the N-type transistors) of the pull-down current generation block (332) and the pull-down current generation block (332) may comprise a current mirror circuit. The N-type transistor logic block (330) may generate the sink current ($I_{sink}$). The N-type transistor logic block (330) may be a current mirroring circuit.

In an embodiment herein, in the first configuration mode, in which the input pin (202) is in floating state, no current may flow through the P-type transistor switch (328). Therefore, there may be no voltage bias generated across the second node (318), and the current mirror block (324) may be OFF. Therefore, there is no pull-up current generated by the pull-up current generation block (322). The N-type transistor logic block (330) may generate the sink current ($I_{sink}$). The value of the sink current ($I_{sink}$) may be greater than that of the pull-up current as there is no pull-up current generated, so the first node (212) may be pulled down, turning the P-type transistor switch (328) ON and the input pin (202) is pulled up to high (e.g., high logic input or high logic voltage) by the voltage source (301).

In an embodiment herein, in the second configuration mode, when the input pin (202) is connected to the input source, an input logic zero may be applied, turning the P-type transistor switch (328) ON. A voltage bias may be generated at the second node (318). The voltage bias at the second node (318) may turn the current mirror block (324) ON. As the pull-up current is generated by the pull-up current generation block (322), the pull-up current generation block (322) may be mirrored by the current mirror block (324) of the P-type transistor logic block (320). Due to the pull-up current generated, the first node (212) may be set to voltage logic level high. Also, the N-type transistor logic block (330) may generate a pull-down current (e.g., the sink current ($I_{sink}$)). The pull-up current generated in the P-type transistor logic block (320) may be greater in value than the sink current ($I_{sink}$) in the second configuration mode. As the first node (212) is set to high, that turns the P-type transistor switch (328) OFF, the input pin (202) may receive an input.

In an embodiment herein, in the second configuration mode, when the input pin (202) is connected to the input source and an input logic one is applied, the input pin (202) may be set to voltage logic level high. The pull-up current generation block (322) may be also set to voltage logic level high, therefore, no current flows through the P-type transistor switch (328).

Figure 4:
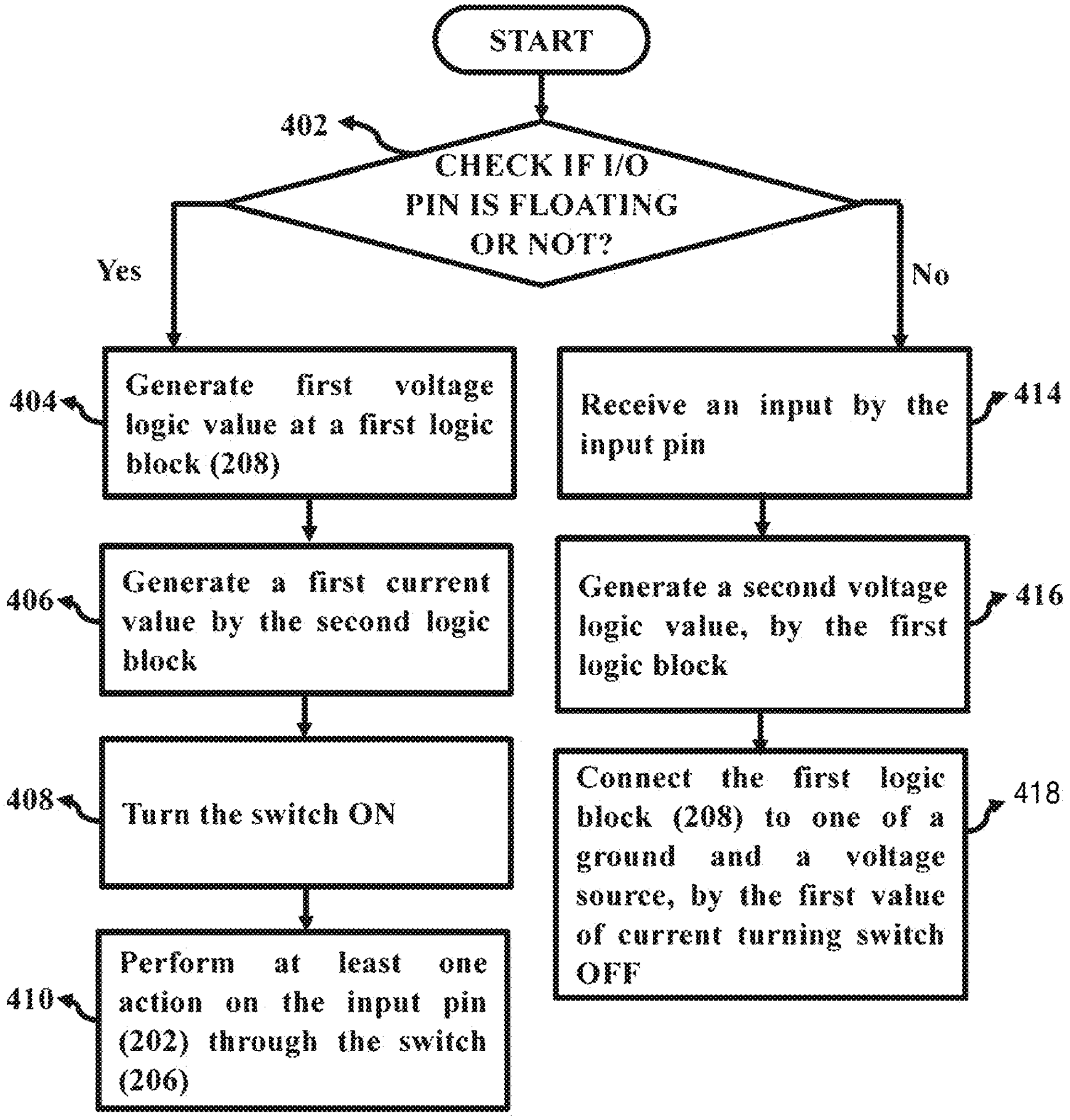
FIG. 4 shows a flowchart for a method to manage the logical behaviour of the input pin, according to the embodiments herein.

FIG. 4 shows a flowchart for a method to manage the logical behaviour of the input pin, according to the embodiments herein. FIG. 4 will be described by the embodiment illustrated with reference to FIG. 3A, but is not limited thereto. At step 402, the semiconductor IC may perform a check to determine if the input pin (202) is in a floating state or not. At step 404, if the input pin (202) is in the floating state, and the semiconductor IC is in a first configuration mode, a first voltage logic value may be generated at the second node (318) by the first transistor block (312). The first voltage logic value may be a bias voltage generated at the second node (318). The generated bias voltage may turn the pull-down current generation block (314) OFF. At step 406, the second logic block (210) may generate the first current value such that the first node (212) may be connected with the second logic block (210) based on the first current value and with the gate terminal (218) of the switch (206). At step 408, the first current value generated at the second logic block (210) when the input pin (202) is in the floating state, may drive the switch (206) in ON mode. At step 410, upon driving the switch (206) in ON mode, the semiconductor IC may perform at least one action on the input pin (202). The at least one action may comprise pulling-up the input pin (202) to voltage logic high in a pull-up circuit and pulling down the input pin (202) to the ground level logic to manage the floating state of the input pin (202).

In an embodiment herein, at step 414, the input pin (202) may be connected to the input source and may be in the second configuration mode. The input pin (202) may be set as high. The input pin (202) may receive a second voltage logic value. The second voltage logic value may be the input source voltage. The second voltage logic value may drive the input pin (202) to provide an input to the semiconductor IC. At step 416, a second voltage logic value may be generated, by a first transistor block (312) at the second node (318) of the first logic block (208). The second voltage logic value may be the bias voltage generated across the second node (318). When the input pin (202) is connected to the input source and the bias voltage across the second node (318) is generated, the bias voltage turns the first logic block (208) ON, on determining the second voltage logic value across the input pin (202). The second logic block (210) may generate the first current value such that the first node (212) is connected with the second logic block (210) based on the first current value and with the gate terminal (218) of the switch (206). At step 418, the first logic block (208) may be connected to one of a ground and a voltage source based on the second voltage logic value, turning switch (206) OFF by the first value of current.

The various actions in method 400 may be performed in the order presented, in a different order or simultaneously. Further, in some embodiments, some actions listed in FIG. 4 may be omitted.

Figure 5A:
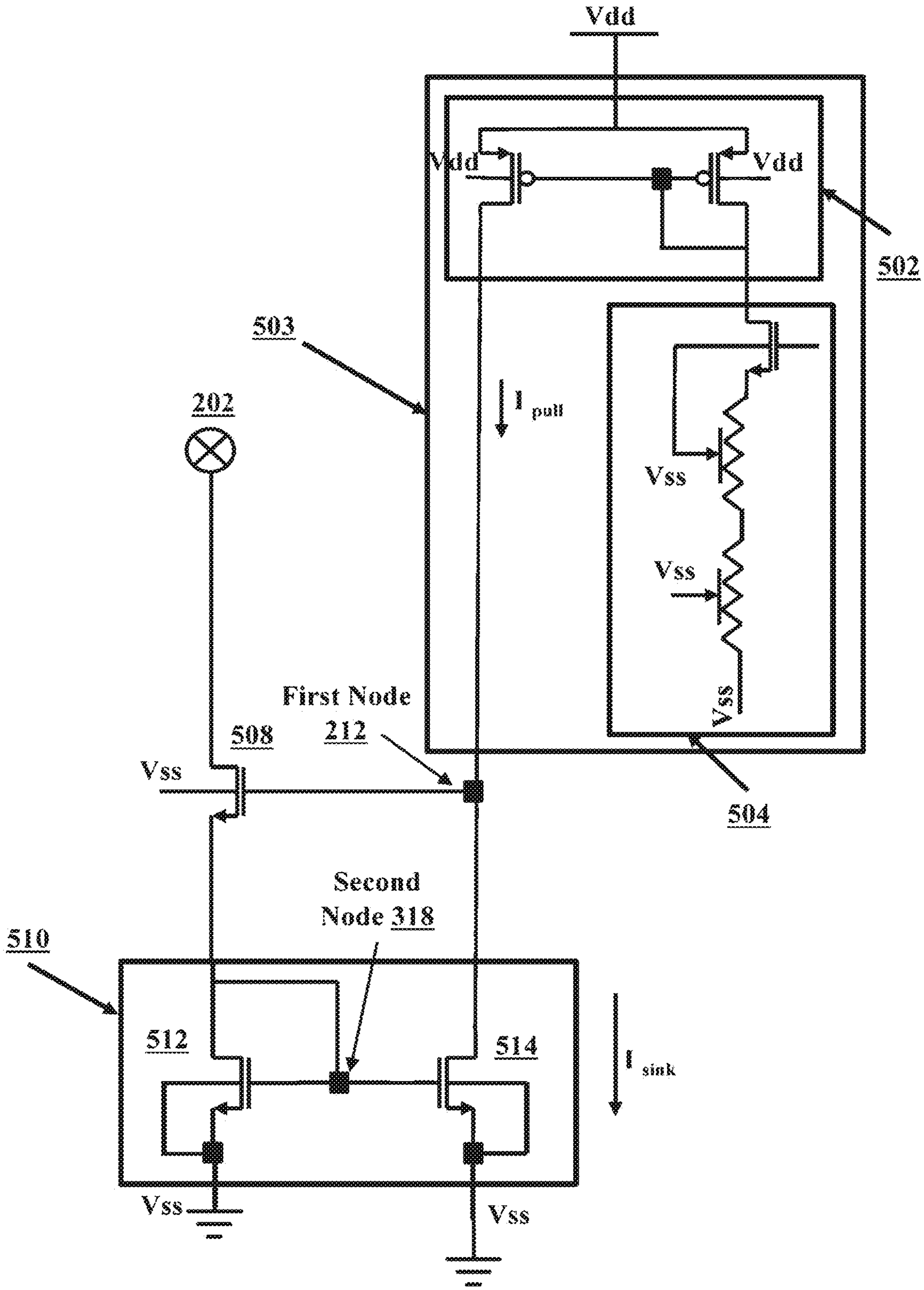
FIG. 5A shows an example of a pull-down circuit of a semiconductor integrated circuit to manage the floating state of the input pin, according to embodiments as disclosed herein.

FIG. 5A shows an example of a pull-down circuit of a semiconductor integrated circuit to manage the floating state of the input pin, according to embodiments as disclosed herein. The pull-up current generation block (504) may be connected to a current mirror block (502). The pull-up current generation block (504) may generate the pull-up current ($I_{pull}$) and the current mirror block (502) may mirror the pull-up current ($I_{pull}$) generated by the pull-up current generation block (504). A NMOS current mirror block (510) may be connected to a MOS device (508) and the current mirror block (502). MOS device (508) may be an NMOS. The NMOS current mirror block (510), when connected to the MOS device (508) and the current mirror block (502), may generate the sink current ($I_{sink}$). In some embodiments, the generated sink current value may be multiple times of the input current value. The MOS device (508) may work as a switch to clamp the input pin (202) to a desired state. For example, the MOS device (508) may either ground the input pin (202) in the floating state or enable the input pin (202) to receive an input voltage from the voltage source.

In an embodiment herein, the pull-down circuit may be an on-chip solution; i.e., the pull-down circuit may be a part of the semiconductor IC at the time of manufacturing. The pull-down circuit may be a system on chip (SoC) solution, therefore no external pull-up or pull-down circuit may be required to manage the logical behaviour of the input pin in the semiconductor IC.

In an embodiment herein, in the first configuration mode, when the input pin (202) is in floating state, a first NMOS transistor block (512) may generate sufficient voltage bias across the second node (318) that turns a second NMOS transistor block (514) of the NMOS current mirror block (510) OFF. The pull-up current may be generated by the pull-up current generation block (504) and the pull-up current may be mirrored by the current mirror block (502). The first node (212) may be pulled up by the generated pull-up current, which turns the MOS device (508) ON. The MOS device (508) may pull the input pin (202) down, therefore, ground the input pin (202). Therefore, the input pin (202), when not connected to any input source and is in floating state, may be grounded by the semiconductor IC.

In an embodiment herein, in the second configuration mode, when the input pin (202) is connected to the input source, the first NMOS transistor block (512) may generate a sufficient bias voltage across the second node (318). As the input pin (202) is connected to the input source, and the bias voltage generated is across the second node (318), the second NMOS transistor block (514) may be turned ON. The sink current value may be greater than the pull-up current value, so the first node (212) is pulled down, turning the MOS device (508) OFF. No current flows through the MOS device (508). In some embodiments, a negligible amount of current (e.g., a few nano ampere) may flow through from the input pin (202) through the MOS device (508) and the first NMOS transistor block (512).

Figure 5B:
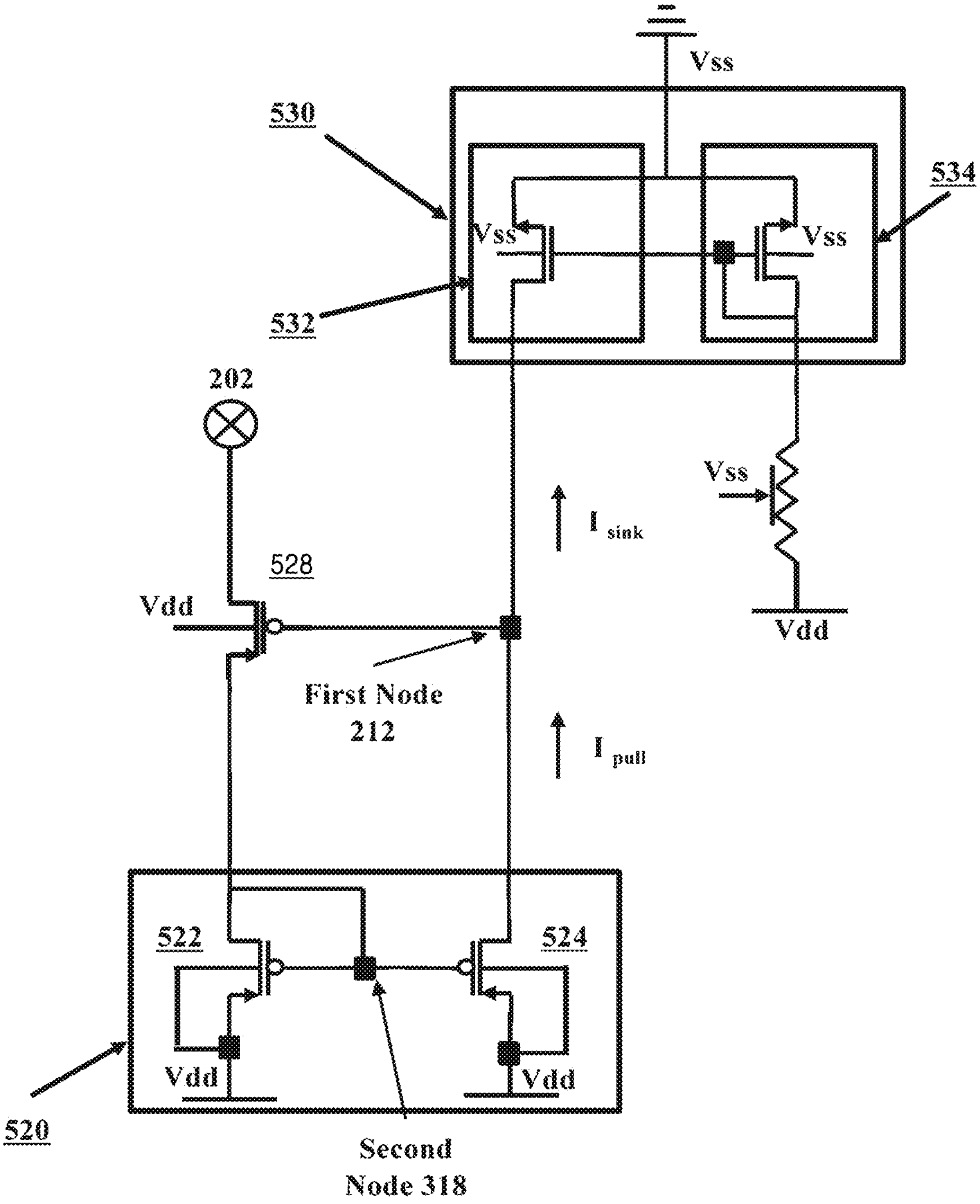
FIG. 5B shows an example of a pull-up circuit of a semiconductor integrated circuit to manage the floating state of the input pin, according to embodiments as disclosed herein.

FIG. 5B shows an example of a pull-up circuit to manage the floating state of the input pin, according to embodiments as disclosed herein. An embodiment herein discloses a pull-up circuit (520) comprising a first PMOS (522) and a second PMOS (524). The first PMOS (522) may be connected in series to the second PMOS (524). The first PMOS (522) may be connected to a source terminal of a transistor switch (e.g., the MOS device 528). The second PMOS (524) may be connected to the N-type transistor logic block (530). The pull-up circuit (520) may be configured to generate a pull-up current when there is a bias voltage generated at a second node (318) of the pull-up circuit (520). An input pin (202) may be connected at a drain terminal of the transistor switch (e.g., the MOS device 528).

In an embodiment herein, the semiconductor integrated circuit may comprise a pull-down circuit comprising an N-type transistor logic block (530) for generating a sink current ($I_{sink}$). The MOS device (528) may work as a switch to clamp the input pin (202) to a desired state, i.e. either pull-up the input pin (202) to the voltage source, when in floating state or enable the input pin (202) to receive an input voltage from the voltage source. The MOS device (528) may be a PMOS.

In an embodiment herein, the pull-up circuit may be an on-chip solution; i.e., the pull-up circuit may be a part of the semiconductor IC at the time of manufacturing. The pull-up circuit may be a system on chip (SoC) solution, therefore no external pull-up or pull-down circuit is required to manage the logical behaviour of the input pin (202) in the semiconductor IC.

In an embodiment herein, in the first configuration mode, when the input pin (202) is in floating state, no current may flow through a MOS device (528). Therefore, there may be no voltage bias generated across the second node (318) and a first PMOS (522) is OFF. Therefore, there is no pull-up current generated by the pull-up circuit (520). The N-type transistor logic block (530) may generate a sink current ($I_{sink}$). The sink current value may be greater than the pull-up current value as there is no pull-up current generated, so the first node (212) may be pulled down, turning the MOS device (528) ON and the input pin is pulled up to high by input supply voltage $V_{dd}$.

In an embodiment herein, in the second configuration mode, when the input pin (202) is connected to the input source, an input logic zero may be applied, turning the MOS device (528) ON. A voltage bias may be generated at a second node (318). The voltage bias at the second node (318) may turn the first PMOS (522) ON. As the pull-up current is generated, the pull-up current may be mirrored by a second PMOS (524) of the current mirroring block. Due to the pullup current generated, the first node (212) may be set to voltage logic level high. Also, there is a sink current ($I_{sink}$) generated in the N-type transistor logic block (530). The pull-up current generated in the second PMOS (524) may be greater in value than the sink current ($I_{sink}$) in the second configuration mode. As the first node (212) is set to high, that turns the MOS device (528) OFF, allowing the input pin to receive input.

In an embodiment herein, in the second configuration mode, when the input pin (202) is connected to the input source, an input logic one is applied, the input pin (202) is set to voltage logic level high. As the second PMOS (524) is also set to voltage logic level high, no current may flow through the MOS device (528).

Figure 6A:
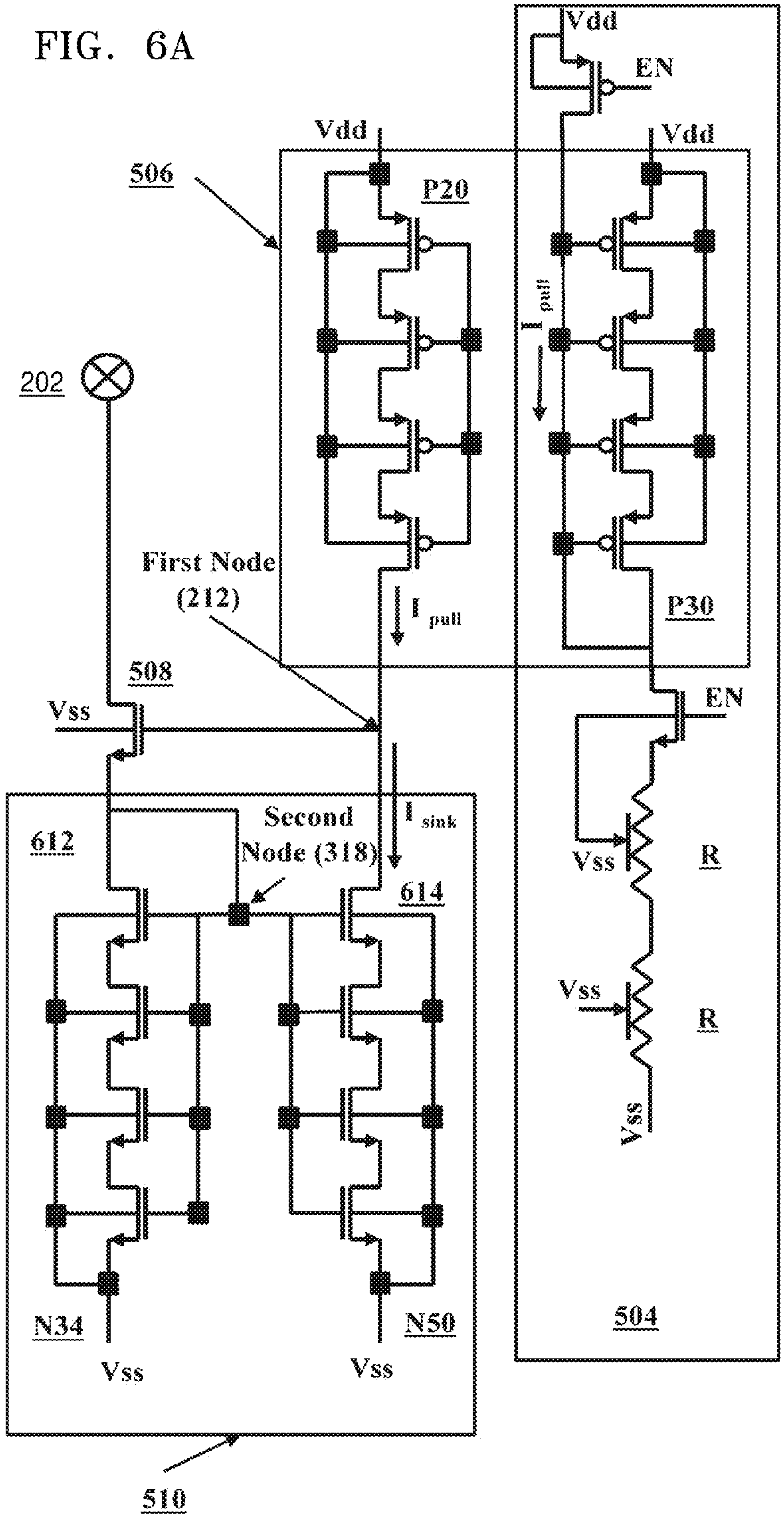
FIG. 6A shows an example semiconductor integrated circuit to manage the floating state of the input pin, according to embodiments as disclosed herein.

FIG. 6A shows an example semiconductor integrated circuit to manage the floating state of the input pin, according to embodiments as disclosed herein. The input pin (202) may be connected to the drain terminal of the MOS device (508) (e.g., NMOS device (508)). The pull-up current generation block (506) may be connected to the pull-up current generation block (504). The pull-up current generation block (506) may be connected to the supply voltage (Vad). The pull-up current generation block (504) may comprise a series of resistive circuits (R). The pull-up current generation block (506) may comprise a plurality of PMOS devices (P20) cascaded in series with each other. Similarly, the pull-up current generation block (504) may comprise a plurality of PMOS devices (P30) cascaded in series with each other. The sensitivity of the pull-up current generation block (506) (e.g., the plurality of PMOS devices (P20) thereof) may match with the sensitivity of the pull-up current generation block (504) (e.g., the plurality of PMOS devices (P30) thereof). For example, P20 of the pull-up current generation block (506) and P30 of the pull-up current generation block (504) may mirror each other. The pull-up current generation block (506) (e.g., the plurality of PMOS devices (P20) thereof) may be connected to a gate terminal of the NMOS device (508) and a pull-down current generation block (614) of the NMOS transistor logic block (510) (e.g., NMOS current mirror block (510)). The NMOS transistor logic block (510) may comprise a first NMOS transistor block (612). The first NMOS transistor block (612) may be connected to the pull-down current generation block (614). The first NMOS transistor block (612) may comprise a plurality of NMOS devices (N34) cascaded in series with each other. Similarly, the pull-down current generation block (614) may comprise a plurality of NMOS devices (N50) cascaded in series with each other. The NMOS transistor logic block (510) may be connected to the ground. The sensitivity of the first NMOS transistor block (612) (e.g., the plurality of NMOS devices (N34)) may match with the sensitivity of the pull-down current generation block (614) (e.g., the plurality of NMOS devices (N50)). The first NMOS transistor block (612) (e.g., the plurality of NMOS devices (N34)) may be connected to the source terminal of the NMOS device (508).

Figure 6B:
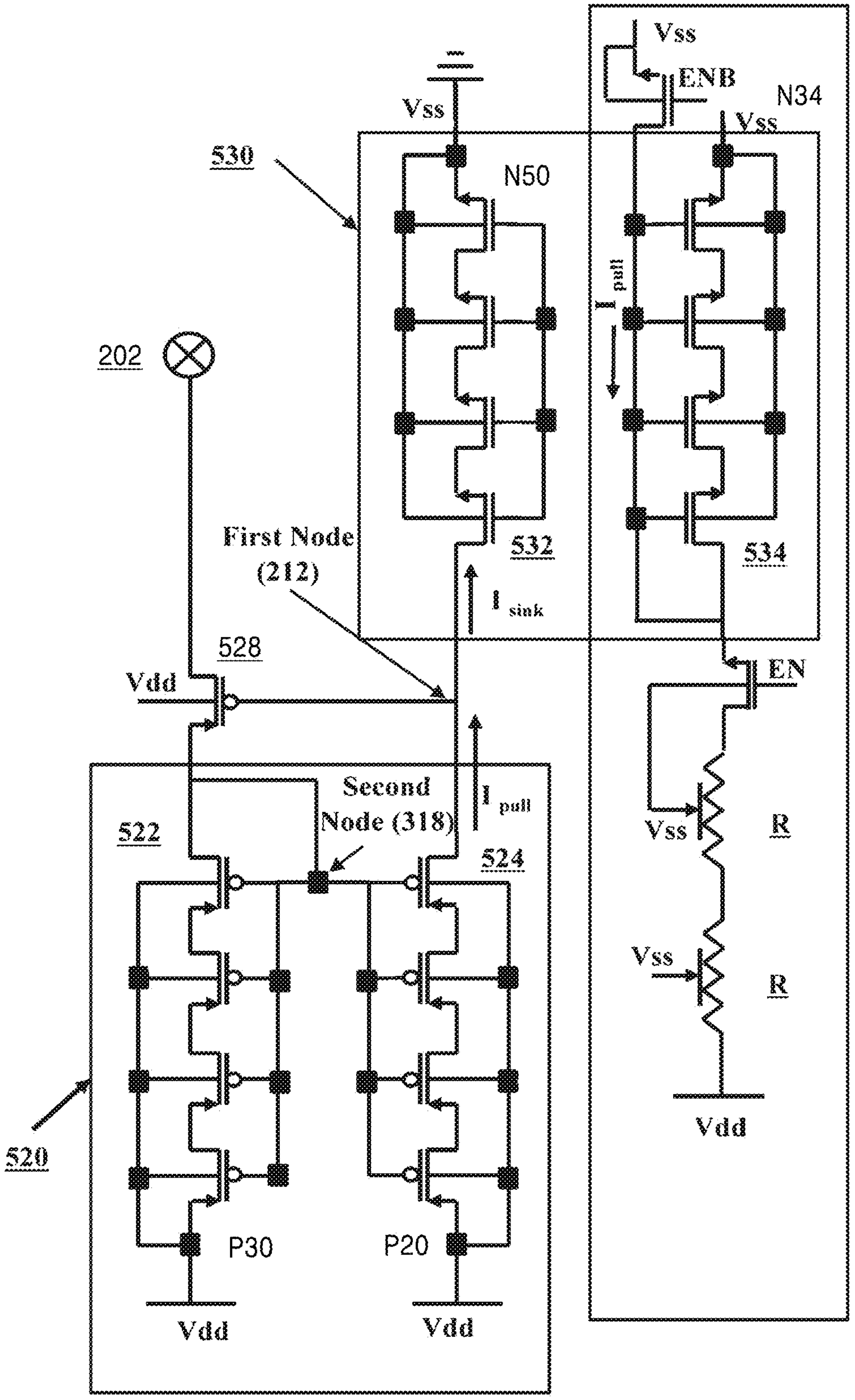
FIG. 6B shows an example semiconductor integrated circuit to manage the floating state of the input pin, according to embodiments as disclosed herein.

FIG. 6B shows an example semiconductor integrated circuit to manage the floating state of the input pin, according to embodiments as disclosed herein. The input pin (202) may be connected to the drain terminal of the MOS device 528 (e.g., the PMOS device (528)). The PMOS transistor logic block (520) (e.g., the pull-up circuit (520)) may comprise a pull-up current generation block (524) (e.g., the second PMOS (524)) and a current generation block (522). The pull-up current generation block (524) may be connected to the current generation block (522) (e.g., the first PMOS (522)). The pull-up current generation block (524) may be connected to the supply voltage ($V_{dd}$). The pull-up current generation block (524) may comprise a plurality of PMOS devices cascaded (P20) in series with each other. Similarly, the current generation block (522) may comprise a plurality of PMOS devices (P30) cascaded in series with each other. The sensitivity of the pull-up current generation block (524) may match with the sensitivity of the current generation block (522). The pull-up current generation block (524) may be connected to a gate terminal of the PMOS device (528) and a pull down current generation block (532) of the NMOS transistor logic block (530) (e.g., the N-type transistor logic block (530)). The NMOS transistor logic block (530) may comprise a first NMOS transistor block (534). The first NMOS transistor block (534) may be connected to the pull-down current generation block (532). The first NMOS transistor block (534) may comprise a plurality of NMOS devices (N34) cascaded in series with each other. Similarly, the pull-down current generation block (532) may comprise a plurality of NMOS devices (N50) cascaded in series with each other. The first NMOS transistor block (534) may further comprise a series of resistive circuits (R). The NMOS transistor logic block (530) may be connected to the ground. The sensitivity of the first NMOS transistor block (534) (e.g., the plurality of NMOS devices (N34) thereof) may match with the sensitivity of the pull-down current generation block (532). The pull-down current generation block (532) may be connected to the source of the PMOS device (528).

Figure 7:
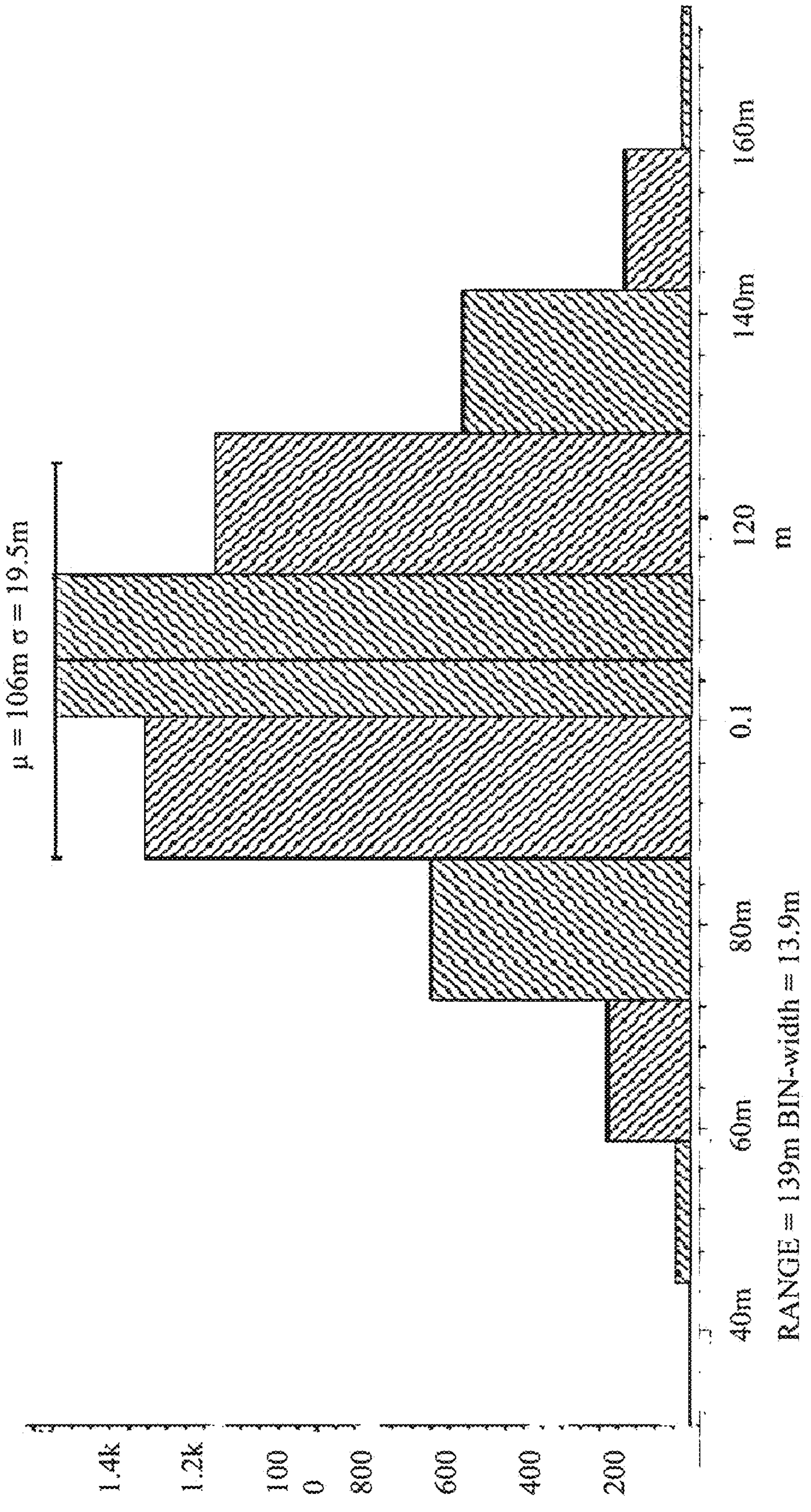
FIG. 7 shows an example graph of Monte Carlo voltage waveform for the input pin in floating state in extreme scenario, according to embodiments as disclosed herein.

FIG. 7 shows an example graph of Monte Carlo voltage waveform for the input pin in floating state in extreme scenario. Samples of the semiconductor IC circuit were tested on a simulation tool. In an embodiment herein, the simulation tool was Monte Carlo Simulation 4.5 Sigma. The results of the simulation are showed in FIG. 7. The Monte Carlo Simulation 4.5 Sigma was run for 5,000 samples of the semiconductor IC, to check the stability of the IC in an extreme scenario of which a semiconductor IC may work in by applying maximum supply voltage. The result show that the voltage level of the input pin in floating state is less than 12 percent of the maximum supply voltage and high temperature.

Figure 8:
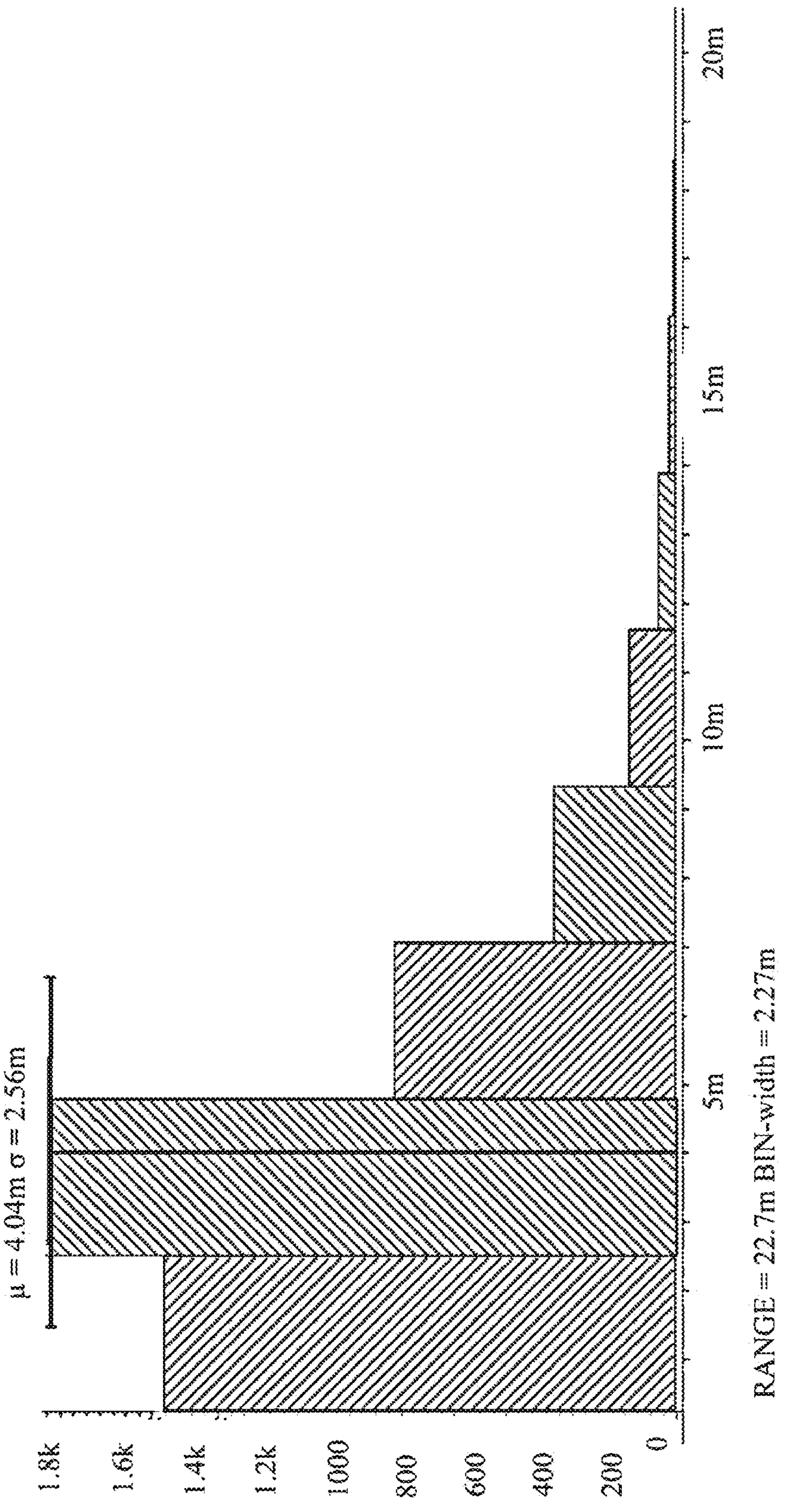
FIG. 8 shows an example graph of Monte Carlo voltage waveform for the input pin in floating state in normal scenario, according to embodiments as disclosed herein.

FIG. 8 shows an example graph of Monte Carlo voltage waveform for the input pin in floating state in normal scenario. Sample semiconductor IC were tested on Monte Carlo Simulation 4.5 Sigma. The results of the simulation are showed in FIG. 8. The Monte Carlo Simulation 4.5 Sigma was run for 5,000 samples of the semiconductor IC, to check the stability of the IC in a normal scenario of which a semiconductor IC may work in by applying maximum supply voltage. The result show that the voltage level of the input pin in floating state is less than 0.5 percent of the maximum supply voltage and high temperature of 125° C.

The foregoing description of the specific embodiments will reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of embodiments, those skilled in the art will recognize that the embodiments herein can be practiced with modification within the scope of the embodiments as described herein.

What is claimed is:

1. A semiconductor integrated circuit, comprising:
- an input pin;
- a switch having a drain terminal electrically connected to the input pin, and configured to be in an ON mode or an OFF mode, responsive to a state of the input pin, wherein the switch is configured to be in the OFF mode when the state of the input pin is in a high logic input;
- a first logic block electrically connected to a gate terminal of the switch and a source terminal of the switch;
- a second logic block electrically connected to the gate terminal of the switch; and
- a first node electrically connected to the first logic block, the second logic block, and the gate terminal of the switch.

2. The semiconductor integrated circuit of claim 1, wherein the switch is configured to be in the ON mode when the state of the input pin is a floating state.

3. The semiconductor integrated circuit of claim 2, wherein the first logic block is configured to generate a first voltage logic value that drives the switch in the ON mode when the state of the input pin is the floating state.

4. The semiconductor integrated circuit of claim 3, wherein the second logic block is configured to generate a first current value when the state of the input pin is the floating state, and
- wherein the first node is electrically connected to the second logic block and the gate terminal of the switch based on the first current value.

5. The semiconductor integrated circuit of claim 2, wherein the first logic block is configured to generate a second voltage logic value that drives the switch in the OFF mode when the state of the input pin is in the high logic input, and
- wherein the first node is electrically connected to the first logic block based on the second voltage logic value.

6. The semiconductor integrated circuit of claim 1, further comprising:
- a voltage source; and
- a ground,
- wherein the input pin is free of having an electrical connection with the voltage source and the ground when the state of the input pin is a floating state.

7. A semiconductor integrated circuit, comprising:
- an input pin;
- a switch including an N-type transistor having a drain terminal electrically connected to the input pin, said switch configured to be in an ON mode or an OFF mode in response to a state of the input pin;
- a first logic block electrically connected to the switch, said first logic block including an N-type transistor logic block, which is electrically connected to a ground voltage, configured to generate a sink current, and comprises:
  - a first transistor block; and
  - a pull-down current generation block electrically connected to the first transistor block, and a gate terminal and a source terminal of the N-type transistor of the switch;
- a second logic block electrically connected to the gate terminal of the N-type transistor; and
- a first node electrically connected to the first logic block, the second logic block, and the switch.

8. The semiconductor integrated circuit of claim 7, wherein the second logic block comprises a P-type transistor logic block,
- wherein the P-type transistor logic block comprises a pull-up current generation block and a current mirror block,
- wherein the pull-up current generation block is electrically connected to the current mirror block,
- wherein the first node is electrically connected to the pull-up current generation block, the pull-down current generation block, and the gate terminal of the N-type transistor,
- wherein the P-type transistor logic block is electrically connected to a voltage source,
- wherein the P-type transistor logic block is configured to generate a first current value,
- wherein the first current value comprises a pull-up current, and
- wherein the current mirror block mirrors the pull-up current.

9. The semiconductor integrated circuit of claim 8, wherein the N-type transistor is configured to pull-up or pull-down the input pin based on the pull-up current and the sink current.

10. The semiconductor integrated circuit of claim 9, wherein, when the state of the input pin is a floating state, the N-type transistor logic block is configured to generate a first voltage logic value to turn off the pull-down current generation block and drive the N-type transistor of the switch in the ON mode.

11. The semiconductor integrated circuit of claim 10, wherein the sink current is less than the pull-up current when the state of the input pin is the floating state.

12. The semiconductor integrated circuit of claim 9, wherein, when the state of the input pin is a high logic input, the N-type transistor logic block is configured to generate a second voltage logic value to turn on the pull-down current generation block and drive the N-type transistor of the switch in the OFF mode.

13. The semiconductor integrated circuit of claim 12, wherein the sink current is greater than the pull-up current when the state of the input pin is the high logic input.

14. A semiconductor integrated circuit, comprising:
- an input pin;
- a switch, wherein the switch is electrically connected to the input pin;
- a first logic block, wherein the first logic block is electrically connected to the switch;
- a second logic block, wherein the second logic block is electrically connected to the switch; and
- a first node that is electrically connected to the first logic block, the second logic block, and the switch, wherein the switch is configured to be in an ON mode or an OFF mode, responsive to a state of the input pin, wherein the switch comprises a P-type transistor, wherein the first logic block comprises a P-type transistor logic block, wherein the P-type transistor logic block comprises a current mirror block and a pull-up current generation block, wherein the pull-up current generation block is electrically connected to the current mirror block, wherein the pull-up current generation block is electrically connected to a gate terminal and a source terminal of the P-type transistor, wherein the second logic block is electrically connected to the gate terminal of the P-type transistor, wherein the input pin is electrically connected to a drain terminal of the P-type transistor, wherein the P-type transistor logic block is electrically connected to a voltage source, and wherein the P-type transistor logic block is configured to generate a pull-up current.

15. The semiconductor integrated circuit of claim 14, wherein the second logic block comprises an N-type transistor logic block, wherein the N-type transistor logic block comprises a pull-down current generation block and a current generation block, wherein the pull-down current generation block is electrically connected to the current generation block, wherein the first node is electrically connected to the pull-down current generation block, the pull-up current generation block, and the gate terminal of the P-type transistor, wherein the N-type transistor logic block is electrically connected to a ground, wherein the N-type transistor logic block is configured to generate a sink current, and wherein the current generation block mirrors the sink current.

16. The semiconductor integrated circuit of claim 15, wherein the P-type transistor is configured to pull-up or pull-down the input pin based on the pull-up current and the sink current.

17. The semiconductor integrated circuit of claim 16, wherein, when the state of the input pin is a floating state, the P-type transistor logic block is configured to generate a first voltage logic value to turn off the current mirror block and drive the P-type transistor of the switch in the ON mode.

18. The semiconductor integrated circuit of claim 17, wherein the sink current is greater than the pull-up current when the state of the input pin is the floating state.

19. The semiconductor integrated circuit of claim 16, wherein, when the state of the input pin is a high logic input, the P-type transistor logic block is configured to generate a second voltage logic value to turn on the current mirror block and drive the P-type transistor of the switch in the OFF mode.

20. The semiconductor integrated circuit of claim 19, wherein the sink current is less than the pull-up current when the state of the input pin is the high logic input.

* * * * *